Feb. 17, 1970 H. N. PARKER 3,496,474

TIME DELAY CUTOFF FOR RADIOS AND THE LIKE

Filed Aug. 8, 1966

INVENTOR.
HAROLD N. PARKER.
By Flam and Flam
ATTORNEYS.

United States Patent Office 3,496,474
Patented Feb. 17, 1970

3,496,474
TIME DELAYED CUTOFF FOR RADIOS AND THE LIKE

Harold N. Parker, Tokyo, Japan, assignor to Lloyd's Electronics International, City of Commerce, Calif., a corporation of California Filed Aug. 8, 1966, Ser. No. 570,830
Int. Cl. H04b *1/28*
U.S. Cl. 325—411 14 Claims

ABSTRACT OF THE DISCLOSURE

An RC time delay circuit is provided for progressively reducing the supply voltage of a transistor radio for ultimate cutoff. The time delay circuit is actuated either by a reduction in volume below a certain level, or by an auxiliary switch. The supply voltage to the local oscillator is scaled so as to cause oscillations to cease prior to the time that the voltage to amplifying transistors reduces to the distortion level.

BRIEF SUMMARY OF THE INVENTION

This invention relates to transistor radios or transceivers having transistor radios.

It has been proposed to utilize a time for the purpose of turning a radio off after a selected time interval. Such operation may be desired for a variety of reasons. The usual reason is to allow the user to fall asleep free of the apprehension that the radio will continue on, with consequent deterioration of components or battery drain Conventional timers of this character abruptly change the audio volume from a certain level to zero. This sudden volume change may in fact wake up the user. One object of this invention is to provide a selectively operable timer circuit in which the audio volume is caused to decay gradually by progressive reduction of the supply voltage to one or more amplifying elements that are necessary to produce audio output. In order to accomplish this purpose, I provide a switching device such as a transistor in series with the battery or other supply, and a decay circuit for controlling the transistor. As the transistor passes through the controlled region, the voltage available to operate the various transistors of the radio correspondingly decays, with consequent reduction in audio level. Ultimately the voltage is reduced to the point where the transistors no longer operate. Finally, the switching device or transistor effectively opens the battery or other supply.

When the supply voltage for operating an amplifying transistor is reduced below a critical value, certain distortions result. Another object of this invention is to provide a timer circuit in which the audio output is cut off just before the level of distortion is reached. For this purpose, I connect the transistor for the local oscillator to the timer circuit in such manner that the local oscillator ceases oscillations before the voltage to the amplifying transistors reduces to the distortion level.

In many situations, the user of a radio will turn the volume down, as for example while talking on the telephone, and then will forget to turn the volume back up. Consequently, the radio may remain on for an extended period of time. Accordingly, another object of this invention is to provide a timer device of this character that is initiated when the volume control is turned down below a preset level. Thus, if the user forgets to turn the volume control up, the radio will shut down automatically. A companion object of this invention is to provide a simple timer circuit that is started simply by interrupting a charging circuit. Accordingly, the control circuit may include, in series, a simple switch for deliberately starting the timer, and a switch ganged with the volume control.

One of the primary objects of this invention is to provide a timer circuit of this character that may be compactly packaged, as for example within a transistor radio cabinet. For this purpose, the circuit is so designed that a physically small potentiometer can be used.

This invention possesses many other advantages, and has other objects which may be made more clearly apparent from a consideration of one embodiment of the invention. For this purpose, there is shown a form in the drawings accompanying and forming a part of the present specification. This form will now be described in detail, illustrating the general principles of the invention.

DETAILED DESCRIPTION

Figures 1, 2:
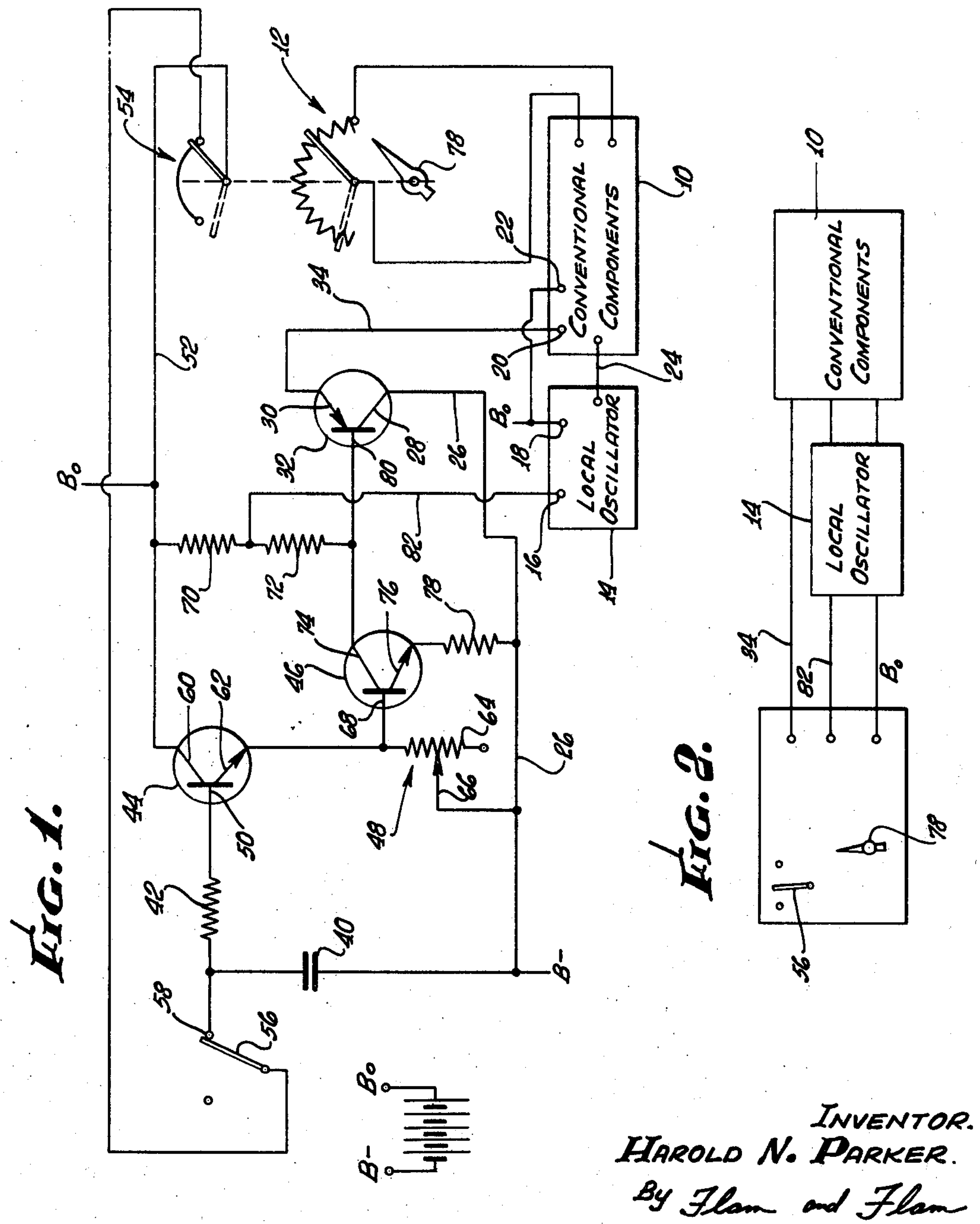
FIGURES 1 and 2 are schematic diagrams of a radio receiver incorporating the present invention.

In FIG. 1, block 10 indicates conventional components of a radio receiver. These conventional components include the tuner, amplifiers, speaker, etc. A volume control potentiometer 12 is separately shown. A local oscillator 14 has power terminals 16 and 18 separate from power terminals 20 and 22 that serve the conventional components 10. A lead 24 connects the output of the oscillator 14 to a heterodyne circuit. The radio components 10 and oscillator 14 incorporate transistor amplifiers capable of operation by a six-volt battery or other supply.

Power to the conventional components 10 is applied from a battery power terminal B−, lead 26, collector 28 and emitter 30 of a series transistor 32, and lead 34 to the power terminal 20. The other power terminal 22 is connected directly to the opposite battery terminal $B_0$. If the transistor 32 is saturated, substantially full voltage is applied to the conventional components 10. However, by progressively reducing the base current of the transistor 32, the voltage across the power input terminals 20 and 22 is reduced as the transistor operates in its controlled region. Ultimately the voltage across the power terminals 20 and 22 is reduced to zero as the transistor 32 cuts off.

When the voltage to the components 10 drops from six volts to about three volts, the transistor amplifiers characteristically enter a range of quite non-linear operation, and when the voltage reduces another half volt to two and a half volts, the amplifier operation ceases. The voltage to the local oscillator power terminals 16 and 18 is maintained about one-half a volt less than at the terminals 20 and 22. Accordingly by means hereinafter to be described, the local oscillator 14 ceases operation as the transistors in the conventional components 10 enter the non-linear range. The audio section thus ceases operation before distortion occurs.

In order to control the operation of the transistor 32, a time delay circuit is provided. This time delay circuit includes a condenser 40, a resistor 42, direct coupled amplifying transistors 44 and 46, and a potentiometer 48. Normally the transistors 44 and 46 are full on, resulting in base current for the series transistor 32 adequate for saturation. Current for the base 50 of the transistor 44 is derived from the battery terminal $B_0$, lead 52, a normally closed wiper switch 54 to be hereinafter described, arm 56 of a bistable control switch, contact 58, resistor 42, base 50. Operating voltage is directly applied to the collector 60 of transistor 44 from the terminal $B_0$. Emitter current flows from emitter 62 to resistor 64 of potentiometer 48, slider 66 thereof to the opposite battery terminal B−. The second transistor 46 is coupled in emitter follower relationship by having its base 68 connected to the emitter 62 of the transistor 44. Load current passes from $B_0$ terminal, collector load resistors 70 and 72, collector 74, emitter 76, a small protective resistor 78 to the B− terminal. Output from the second transistor in this instance is derived from the collector 74, the collector 74 being directly connected to the base 80 of the series transistor 32.

Resistors 70 and 72 form a convenient means for providing a voltage for the oscillator 14 that is always about one-half a volt less than the voltage applied to the other components 10. Thus a lead 82 from the oscillator terminal connects between the resistors 70 and 72. When the transistor 46 is saturated, resistors 70 and 72 are in effect connected directly across the battery terminals, and if the battery voltage is six volts, the voltage at terminal 16 will be less. At this time the terminal 20 for the conventional components is six volts. As transistor 46 enters its controlled region to reduce voltage at emitter 30, the voltage also reduces across the divider network. By properly scaling resistors 70 and 72, the voltage to the local oscillator reaches a cutoff value before the voltage at terminal 20 reaches the distortion range.

Switch contact 58 when connected to terminal $B_0$, causes high level conduction through transistor 44, resulting in emitter 62 and base 68 being adequately positive to saturate transistor 46. Consequently, the collector 74 is adequately negative to saturate the series transistor 32, and full voltage battery is applied across terminals 20 and 22 while voltage almost equal to full battery voltage is applied to the local oscillator 14.

While the switch arm 56 is closed, the condenser 40 is fully charged. When the switch arm 56 is opened, the charge on the condenser slowly leaks off through the resistor 42, the potentiometer resistor 48 and the base circuit of the transistor 46. Transistor 44 slowly shuts off, causing corresponding operation of the transistors 46 and 32 with consequent voltage decay at the power terminals for the local oscillator and other conventional components 10. The local oscillator ceases operation before the other amplifiers enter the non-linear range. Ultimately the transistor 32 cuts off and interrupts all power to the system.

The time necessary for the radio receiver to cease audible operation depends upon the value of the condenser 40, the value of the resistor 42, and the set value of the potentiometer resistor 64 as well as the input impedance of the transistor 46. For values shown, the time constant of the circuit may be varied from a minimum of about twenty-five minutes to a maximum of about fifty minutes. However, the radio operation ceases relatively high upon the decay curve. Consequently, the radio may play for an extended period of from, say, ten to twenty minutes, depending upon the potentiometer setting. By locating the potentiometer in the output circuit of the transistor 44, its ohmic size need be only a fraction of what would be necessary were it included in the input circuit. The potentiometer resistor 64 is reflected into the input circuit by the beta factor of the transistor 44, which may be from 50 to 200. Thus the potentiometer 48 can be a physically small component. Accordingly, a 50K potentiometer in the output circuit appears to have an effective value of about 3–5 megohms in the input circuit, and the time constant of the circuit can be varied by a considerable factor. The potentiometer slider 66 is moved by an accessible knob or lever (not shown).

The values of the resistor 42 and condenser 40 are necessarily high in order to provide an adequate time constant. The ohmic value of resistor 42 must be small enough to allow saturating current to the transistor 44, using the full source voltage available. The size of the condenser 40 thus is determined from the desired RC time constant. The large input impedance is matched by the aid of the emitter follower relationship.

The wiper switch 54 remains closed except when the volume control knob 78 is turned to a predetermined low audio level. At such low level, the wiper switch opens, and initiates the timing cycle in the same manner as if the switch arm 56 were moved.

The radio also has a conventional on-off switch (not shown) for immediate control of the radio receiver.

The time delay circuit may be considered a part of the power supply (FIG. 2) wherein the leads 34 and 82 provide −6 volts and −5.5 volts respectively. The voltage at leads 34 and 82 gradually decays when switch arm 56 is operated.

The inventor claims:

1. In combination: a radio receiver cooperable with a power supply, said receiver having an amplifier device, the amplifying characteristics of which are a function of the operating potential supplied by said power supply; a controllable device coupling the power supply to said amplifier device having an on-off conductivity characteristic as well as intermediate controllable conductivity characteristics; a control circuit for said controllable device including an RC timing circuit; switch means for initiating operation of the timing circuit; and circuit means between the timing circuit and the controllable device for progressively shifting the operating characteristics of said controllable device gradually from its on state to its off state through the region of intermediate controllable conductivity characteristics progressively to introduce a drop in potential between said power supply and said amplifier device whereby said amplifier device gradually ceases amplifying operation.

2. In combination: a radio receiver cooperable with a power supply, and having an amplifier device, the amplifying characteristics of which are a function of the operating potential supplied by said power supply; a transistor having a collector and an emitter serially interposed between said power supply and said amplifier device, and having a base; a control circuit for said transistor including an RC timing circuit; switch means movable from one position for initiating operation of said timing circuit; circuit means connecting the base to said timing circuit and determining a high conduction state of said transistor when said switch means is in said one position; said timing circuit causing a gradual decrease in conductivity of said transistor following movement of said switch means from said one position whereby said amplifying device gradually ceases amplifying operation.

3. The combination as set forth in claim 2 together with an adjustable circuit element in said timing circuit for varying the time constant thereof.

4. The combination as set forth in claim 2 together with a volume control for said radio receiver, and a second switch means serially associated with said first switch means and opened only when said volume control is set to a predetermined low level.

5. In combination: a radio receiver cooperable with a power supply, and having an amplifier device, the amplifying characteristics of which are a function of the operating potential supplied by said power supply; a transistor having a collector and an emitter serially interposed between between said power supply and said amplifier device, and having a base; a control circuit for said transistor including an RC network; means normally charging the RC network; said RC network having an intermediate terminal the voltage of which gradually decays with a time constant of the order of minutes; and circuit means connecting said terminal to said base.

6. In combination with a radio receiver having an amplifying element the operation of which is required for the production of audio output: a power supply having an output terminal providing normal operating voltage for said amplifying element; and manually controlled means selectively operable for causing the operating voltage of said power supply progressively to decay through a time period of the order of minutes.

7. In combination with a radio receiver having an amplifier and a local oscillator, the amplifier and the local oscillator both having similar transistor amplifying elements that have normal linear characteristics and nonlinear characteristics when the operating voltage is reduced to a certain level; a power supply having a pair of terminals providing a normal voltage respectively for said amplifier and said local oscillator; means maintaining the voltage of said local oscillator terminal slightly less than at the amplifier terminal whereby said local oscillator ceases operation before said amplifier operates with nonlinear characteristics when said normal voltage progressively decays; and manually controlled means for causing the voltage of said power supply terminals progressively to decay through a time period of the order of minutes.

8. The combination as set forth in claim 6 together with manual control means for adjusting said time period.

9. In combination: a radio receiver cooperable with a power supply, and having an amplifier and a local oscillator, said amplifier and local oscillator both having transistor amplifying elements the amplifying characteristics of which are functions of the operating potential supplied by said power supply; a transistor having a collector and an emitter serially interposed between said power supply and said amplifier, and having a base connected to the local oscillator to supply power thereto; a control circuit for said transistor including an RC network; means normally charging the RC network; said RC network having an intermediate terminal the voltage of which gradually decays with a time constant of the order of minutes; and circuit means connecting said terminal to said base.

10. The combination as set forth in claim 9 together with manual control means for adjusting said time constant.

11. In combination: a radio receiver cooperable with a power supply, and having an amplifier device, the amplifying characteristics of which are a function of the operating potential supplied by said power supply; a series transistor having an emitter and a collector serially interposed between said power supply and said amplifier device, and having a base; an amplifying transistor connected in emitter follower relationship with said series transistor; a potentiometer resistor paralleling the input of said series transistor and having a slider for adjusting the value thereof; and an input circuit for said amplifying transistor, including a condenser and a resistor serially connected to the base of said amplifying transistor, and a bistable switch operative normally to charge said condenser and to provide biasing current for said amplifying transistor through said serially connected resistor.

12. The combination as set forth in claim 3, together with a volume control for said radio receiver and a second switch means serially associated with said first switch means and opened only when said volume control is set to a predetermined low level.

13. The combination as set forth in claim 7 together with manual control means for adjusting said time period.

14. The combination as set forth in claim 1 in which said receiver has a local oscillator including another amplifying device the amplifying characteristics of which are similarly a function of the operating potential supplied thereto; means connecting said other amplifying device to said power supply through said controllable device; and means continuously maintaining the voltage to said other amplifying device at a level slightly less than the level of voltage to said first amplifying device whereby said local oscillator ceases to function before said first amplifying device as voltage to both amplifying devices is reduced.

References Cited

UNITED STATES PATENTS

| | | | |
|---|---|---|---|
| 3,315,167 | 4/1967 | Goldwasser | 325—396 |
| 2,926,245 | 2/1960 | Denk | 325—396 |
| 2,359,080 | 9/1944 | Bivens | 328—72 |
| 2,463,318 | 3/1949 | Schneider et al. | 328—129 |
| 2,876,344 | 3/1959 | Miller | 325—457 |

OTHER REFERENCES

General Electric SCR Manual, General Electric, 3rd ed., 1964, p. 134.

ROBERT L. GRIFFIN, Primary Examiner

JAMES A. BRODSKY, Assistant Examiner

U.S. Cl. X.R.

325—399, 408; 330—141